United States Patent
Wang

(10) Patent No.: US 11,008,215 B2
(45) Date of Patent: May 18, 2021

(54) COMPLEMENTARY METAL-OXIDE-SEMICONDUCTOR (CMOS) MICRO ELECTRO-MECHANICAL (MEMS) MICROPHONE AND METHOD FOR FABRICATING THE SAME

(71) Applicant: Chuan-Wei Wang, Taoyuan (TW)

(72) Inventor: Chuan-Wei Wang, Taoyuan (TW)

( * ) Notice: Subject to any disclaimer, the term of this patent is extended or adjusted under 35 U.S.C. 154(b) by 23 days.

(21) Appl. No.: 16/695,839

(22) Filed: Nov. 26, 2019

(65) Prior Publication Data

US 2020/0207613 A1 Jul. 2, 2020

(30) Foreign Application Priority Data

Dec. 28, 2018 (TW) .................................. 107147562
May 23, 2019 (CN) .......................... 201910435517.6

(51) Int. Cl.
*B81C 1/00* (2006.01)

(52) U.S. Cl.
CPC ...... *B81C 1/00246* (2013.01); *B81C 1/00531* (2013.01); *B81C 1/00539* (2013.01); *B81B 2201/0257* (2013.01); *B81C 2203/0714* (2013.01)

(58) Field of Classification Search
CPC ............ B81C 1/00246; B81C 1/00531; B81C 1/00539; B81C 2203/0714; B81B 2201/0257; H04R 31/00; H04R 2201/003; H04R 19/005

See application file for complete search history.

(56) References Cited

U.S. PATENT DOCUMENTS

| | | |
|---|---|---|
| 7,666,698 B2 | 2/2010 | Zurcher |
| 9,758,370 B2 | 9/2017 | Zinn et al. |
| 2007/0218661 A1 | 9/2007 | Shroff et al. |
| 2012/0076172 A1* | 3/2012 | Gill .................. G01K 5/52 374/188 |
| 2013/0161702 A1 | 6/2013 | Chen |

(Continued)

FOREIGN PATENT DOCUMENTS

EP     2536168 A2     12/2012

OTHER PUBLICATIONS

Hofmann et al. "High-Q MEMS Resonators for Laser Beam Scanning Displays," Micromachines, 3, pp. 509-528, 2012) (Year: 2012).*

(Continued)

*Primary Examiner* — Yasser A Abdelaziez
(74) *Attorney, Agent, or Firm* — Rosenberg, Klein & Lee

(57) ABSTRACT

A complementary metal-oxide-semiconductor (CMOS) micro electro-mechanical system (MEMS) microphone and a method for fabricating the same are disclosed. Firstly, a CMOS device including a semiconductor substrate, a first oxide insulation layer, a doped polysilicon layer, a second oxide insulation layer, a patterned polysilicon layer, and a metal wiring layer from bottom to top. The metal wiring layer is formed on the second oxide insulation layer. The patterned polysilicon layer includes undoped polysilicon. Then, a part of the metal wiring layer is removed to form a metal electrode and the semiconductor substrate is penetrated to have a chamber and expose the first oxide insulation layer, thereby forming a MEMS microphone.

11 Claims, 10 Drawing Sheets

(56) References Cited

U.S. PATENT DOCUMENTS

| | | | |
|---|---|---|---|
| 2015/0060956 A1* | 3/2015 | Chen | G01L 9/0045 |
| | | | 257/254 |
| 2015/0061048 A1 | 3/2015 | Escher-Poeppel et al. | |
| 2016/0241965 A1 | 8/2016 | Chau | |
| 2018/0332405 A1* | 11/2018 | Kim | H04R 1/04 |

OTHER PUBLICATIONS

Naga Sivakumar Yagnamurthy, Effect of Grain Structure and Doping on the Mechanical Properties of Polysilicon Thin Films for MEMS, Dissertation, Doctor of Philosophy in Aerospace Engineering in the Graduate College of the University of Illinois at Urbana-Champaign, 2013.

* cited by examiner

COMPLEMENTARY METAL-OXIDE-SEMICONDUCTOR (CMOS) MICRO ELECTRO-MECHANICAL (MEMS) MICROPHONE AND METHOD FOR FABRICATING THE SAME

This application claims priority for Taiwan (R.O.C.) patent application no. 107147562 filed on Dec. 28, 2018 and Chinese (P.R.C.) patent application no. 201910435517.6 filed on May 23, 2019, the content of which is incorporated by reference in its entirely.

BACKGROUND OF THE INVENTION

Field of the Invention

The present invention relates to the technology for fabricating a microphone, particularly to a complementary metal-oxide-semiconductor (CMOS) micro electro-mechanical system (MEMS) microphone and a method for fabricating the same.

Description of the Related Art

In the past thirty years, the complementary metal oxide semiconductor (CMOS) has been used extensively in the manufacturing of Integrated Circuits (IC). The development and innovation of IC have progressed by leaps and bounds, due to huge amount of research manpower and investment put in, to raise significantly its reliability and yields; meanwhile, its production cost is reduced drastically. Presently, that technology has reached a mature and stable level, such that for the continued development of the semiconductor, in addition to keeping up the present trend of technical development, it is essential to achieve breakthrough to provide special production process, and enhance system integration of high concentration.

In this respect, the Micro Electro-Mechanical System (MEMS) is a new processing technology completely different from the convention technology. It mainly utilizes the semiconductor technology to produce MEMS structure; meanwhile it is capable of making products having electronic and mechanical functions. As such, it has the advantages of batch processing, miniaturization, and high performance, and is very suitable for use in Production Industries requiring mass production at reduced cost. Therefore, for this stable and progressing CMOS technology, the integration of MEMS and circuitry can be a better approach to achieve system integration. As shown in FIG. 1, the conventional MEMS microphone has a backplate 10, a diaphragm 12, and a semiconductor substrate 14. There is a gap between the backplate 10 and the diaphragm 12. The semiconductor substrate 14 is bored to have a cavity 16. The cavity 16 is arranged under the diaphragm 12. The diaphragm 12 vibrates when air vibrates to transmit sound pressure to the diaphragm 12. If there are some errors in fabrication processes, the backplate 10 and the diaphragm 12 are short-circuited when a voltage is applied across the backplate 10 and the diaphragm 12. For example, the EP Patent No. 2536168A2 and the U.S. Pat. No. 9,758,370 disclosed microphone structures. There is no blocker between the backplate and the diaphragm of the microphone structure. Thus, the backplate and the diaphragm are easily short-circuited when the diaphragm vibrates. Besides, although the U.S. Pat. No. 7,666,698 uses an etch stop layer to form a cavity above a MEMS device, the etch stop layer is made of SiN, not polysilicon used in standard process. The US Patent Publication No. 20070218661A1 patterns and etches an intrinsic polysilicon layer to form an ion-doped gate, which is extraneous to a microphone structure.

To overcome the abovementioned problems, the present invention provides a complementary metal-oxide-semiconductor (CMOS) micro electro-mechanical system (MEMS) microphone and a method for fabricating the same.

SUMMARY OF THE INVENTION

The primary objective of the present invention is to provide a complementary metal-oxide-semiconductor (CMOS) micro electro-mechanical system (MEMS) microphone and a method for fabricating the same, which use the undoped polysilicon of a patterned polysilicon layer to separate a doped polysilicon layer from a metal electrode, thereby avoiding short-circuiting a doped polysilicon layer and the metal electrode and etching the doped polysilicon layer.

Another objective of the present invention is to provide a CMOS MEMS microphone and a method for fabricating the same, which form a part of a patterned undoped polysilicon between a part of a metal electrode and a part of a patterned doped polysilicon layer and use the part of a patterned undoped polysilicon to separate the part of a metal electrode from the part of a patterned doped polysilicon layer. The horizontal position of the part of the metal electrode is different from that of the part of the patterned doped polysilicon layer, lest electrostatic forces be vertically formed between the metal electrode and the patterned doped polysilicon layer such that the metal electrode and the patterned doped polysilicon layer attract to cause a short-circuit event and influence the efficiency of the microphone.

To achieve the abovementioned objectives, the present invention provides a method for fabricating a CMOS MEMS microphone, which comprises: providing a complementary metal-oxide-semiconductor (CMOS) device comprising a semiconductor substrate, a first oxide insulation layer, a doped polysilicon layer, a second oxide insulation layer, a patterned polysilicon layer, and a metal wiring layer from bottom to top, the metal wiring layer is formed on the second oxide insulation layer, and the patterned polysilicon layer comprises undoped polysilicon; and removing a part of the metal wiring layer to form a metal electrode over the undoped polysilicon, using the undoped polysilicon to separate the metal electrode from the doped polysilicon layer, and penetrating through the semiconductor substrate to form a chamber and expose the first oxide insulation layer, thereby forming a micro electro-mechanical system (MEMS) microphone. The doped polysilicon layer is used as a vibration diaphragm.

In an embodiment of the present invention, after removing the part of the metal wiring layer to form the metal electrode, the semiconductor substrate is penetrated to have the chamber and expose the first oxide insulation layer.

In an embodiment of the present invention, after penetrating through the semiconductor substrate to form the chamber and expose the first oxide insulation layer, the part of the metal wiring layer is removed to form the metal electrode.

In an embodiment of the present invention, the metal wiring layer comprises an oxide insulation structure, a first metal layer, a second metal layer, a first metal via, a second metal via, and a third metal layer, the first metal layer, the second metal layer, the first metal via, the second metal via, and the third metal layer comprise conductive material, the oxide insulation structure is formed on the second oxide insulation layer and the patterned polysilicon layer, the first metal layer, the second metal layer, the first metal via, the second metal via, and the third metal layer are embedded in the oxide insulation structure, the first metal layer, the second metal layer, and the third metal layer separate from each other, the first metal layer, the second metal layer, and the third metal layer are formed from bottom to top, the first metal layer separates from the patterned polysilicon layer, the first metal via is formed between the second metal layer and the third metal layer and electrically connected to the second metal layer and the third metal layer, and the second metal via is connected to the third metal layer and at least one of the second oxide insulation layer and the undoped polysilicon.

In an embodiment of the present invention, the oxide insulation structure comprises $SiO_2$.

In an embodiment of the present invention, the metal wiring layer further comprises a SiN layer formed on the oxide insulation structure and the third metal layer.

In an embodiment of the present invention, after removing a part of the oxide insulation structure to expose a part of the patterned polysilicon layer, the remains of the oxide insulation structure, the first metal layer, and a part of the second metal layer are removed and the first metal via, the third metal layer, and the remains of the second metal layer form the metal electrode.

In an embodiment of the present invention, the part of the oxide insulation structure is removed using a dry etching method, the remains of the oxide insulation structure, the first metal layer, and the part of the second metal layer are removed using a wet etching method.

In an embodiment of the present invention, the chamber is formed using a deep reactive ion etching (DRIE) method.

In an embodiment of the present invention, the patterned polysilicon layer further comprises doped polysilicon.

In an embodiment of the present invention, the semiconductor substrate is a Si substrate and the first oxide insulation layer and the second oxide insulation layer are $SiO_2$ layers.

The present invention also provides a method for fabricating a complementary metal-oxide-semiconductor (CMOS) micro electro-mechanical system (MEMS) microphone, which comprises: providing a complementary metal-oxide-semiconductor (CMOS) device comprising a semiconductor substrate, a first oxide insulation layer, a patterned doped polysilicon layer, at least one oxide insulation block, a second oxide insulation layer, a patterned undoped polysilicon layer, and a metal wiring layer, the first oxide insulation layer is formed on the semiconductor substrate, the patterned doped polysilicon layer and the at least one oxide insulation block are formed on the first oxide insulation layer, the second oxide insulation layer is formed on the patterned doped polysilicon layer and the at least one oxide insulation block, and the metal wiring layer is formed on the second oxide insulation layer; and removing a part of the metal wiring layer, a part of the second oxide insulation layer, a part of the at least one oxide insulation block, and a part of the first oxide insulation layer to form a metal electrode, a part of the patterned undoped polysilicon layer is formed between a part of the metal electrode and a part of the patterned doped polysilicon layer, using the part of the patterned undoped polysilicon layer to separate the part of the metal electrode from the part of the patterned doped polysilicon layer, the horizontal position of the part of the metal electrode is different from the horizontal position of the part of the patterned doped polysilicon layer, and penetrating through the semiconductor substrate to form a chamber and expose the patterned doped polysilicon layer, thereby forming a micro electro-mechanical system (MEMS) microphone.

In an embodiment of the present invention, after removing the part of the metal wiring layer, the part of the second oxide insulation layer, the part of the at least one oxide insulation block, and the part of the first oxide insulation layer to form the metal electrode, the semiconductor substrate is penetrated to have the chamber and expose the patterned doped polysilicon layer.

In an embodiment of the present invention, after penetrating through the semiconductor substrate to form the chamber, the part of the metal wiring layer, the part of the second oxide insulation layer, the part of the at least one oxide insulation block, and the part of the first oxide insulation layer are removed to form the metal electrode and expose the patterned doped polysilicon layer.

In an embodiment of the present invention, the metal wiring layer comprises an oxide insulation structure, a metal structure, and a metal via, the oxide insulation structure is formed on the second oxide insulation layer and the patterned undoped polysilicon layer, the metal structure and the metal via are embedded in the oxide insulation structure, the top of the metal via is connected to the bottom of the metal structure, and the bottom of the metal via penetrates through the patterned undoped polysilicon layer and the second oxide insulation layer to connect to the patterned doped polysilicon layer.

In an embodiment of the present invention, the oxide insulation structure comprises $SiO_2$.

In an embodiment of the present invention, the oxide insulation structure, the part of the second oxide insulation layer, the part of the at least one oxide insulation block, and the part of the first oxide insulation layer are removed to expose the patterned undoped polysilicon layer and the metal via and the metal structure form the metal electrode.

In an embodiment of the present invention, the chamber is formed using a deep reactive ion etching (DRIE) method.

In an embodiment of the present invention, the semiconductor substrate is a silicon substrate and the first oxide insulation layer, the at least one oxide insulation block, and the second oxide insulation layer comprise $SiO_2$.

The present invention further provides a complementary metal-oxide-semiconductor (CMOS) micro electro-mechanical system (MEMS) microphone comprises a semiconductor substrate penetrated with a chamber; a first oxide insulation layer penetrated with a first opening and formed on the semiconductor substrate, and the first opening communicates with the chamber; a patterned doped polysilicon layer and at least one oxide insulation block formed on the first oxide insulation layer, and the at least one oxide insulation block is penetrated with at least one second opening that communicates with the first opening; a second oxide insulation layer formed on the patterned doped polysilicon layer and the at least one oxide insulation block, the second oxide insulation layer is penetrated with at least one third opening, and the at least one third opening communicates with the at least one second opening; a patterned undoped polysilicon layer formed on the second oxide insulation layer; and a metal electrode with a bottom thereof penetrating through the patterned undoped polysilicon layer and the second oxide insulation layer and connecting to the patterned doped polysilicon layer, a part of the patterned undoped polysilicon layer is formed between a part of the metal electrode and a part of the patterned doped polysilicon layer, the part of the patterned undoped polysilicon layer separates the part of the metal electrode from the part of the patterned doped polysilicon layer, and the horizontal position of the part of the metal electrode is different from the horizontal position of the part of the patterned doped polysilicon layer.

In an embodiment of the present invention, the semiconductor substrate is a silicon substrate and the first oxide insulation layer, the at least one oxide insulation block, and the second oxide insulation layer comprise $SiO_2$.

Below, the embodiments are described in detail in cooperation with the drawings to make easily understood the technical contents, characteristics and accomplishments of the present invention.

DETAILED DESCRIPTION OF THE INVENTION

Figure 1:
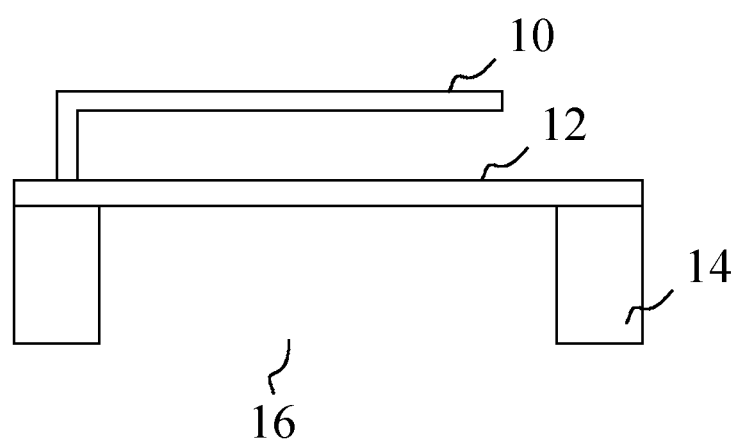
FIG. 1 is a diagram schematically showing a micro electro-mechanical system (MEMS) microphone in the conventional technology.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

In general, polysilicon used in complementary metal-oxide-semiconductor (CMOS) process is doped with N-type or P-type ions to form conductive material that is used to form gates, resistors, and poly-insulator-poly (PIP) capacitors. However, the present invention uses intrinsic polysilicon instead of doping any ion into polysilicon. Intrinsic polysilicon forms etch stop layers in fabricating a micro electro-mechanical system (MEMS) microphone and avoids a short-circuit event occurring in the microphone.

Figure 2A:
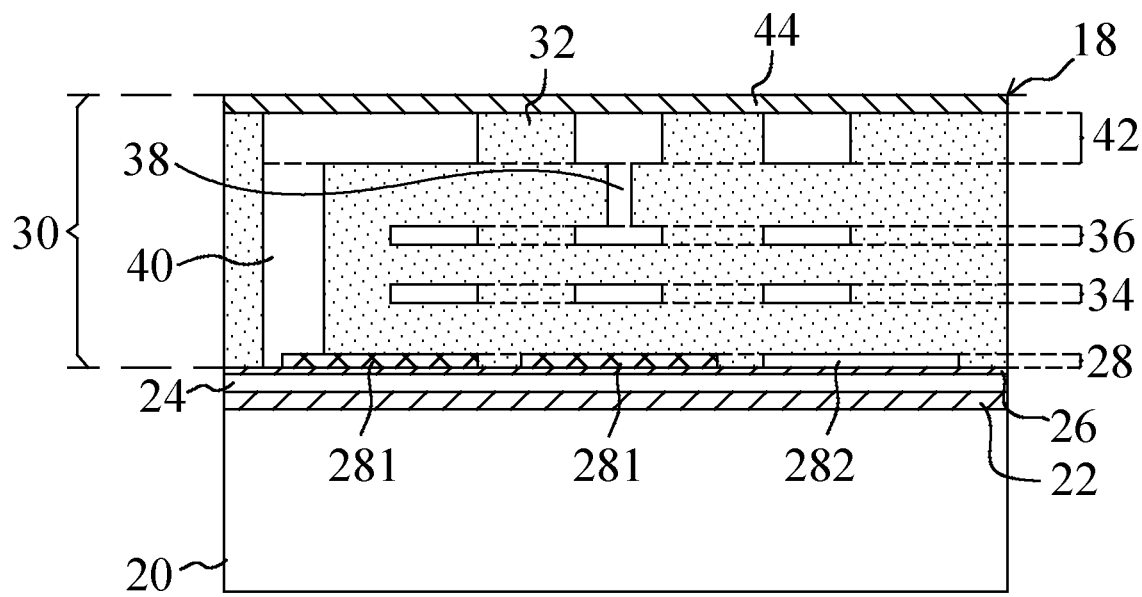
FIGS. 2(a)-2(d) are diagrams schematically showing the steps of fabricating a complementary metal-oxide-semiconductor (CMOS) micro electro-mechanical system (MEMS) microphone according to the first embodiment of the present invention.

Refer to FIGS. 2(a)-2(d). The first embodiment of the method for fabricating a CMOS MEMS microphone is introduced as follows. Firstly, as shown in FIG. 2(a), a CMOS device 18 is provided, which comprises a semiconductor substrate 20, a first oxide insulation layer 22, a doped polysilicon layer 24, a second oxide insulation layer 26, a patterned polysilicon layer 28, and a metal wiring layer 30 from bottom to top. The metal wiring layer 30 is formed on the second oxide insulation layer 26. The patterned polysilicon layer 28 only comprises undoped polysilicon or comprises both of undoped polysilicon and doped polysilicon. When the patterned polysilicon layer 28 only comprises undoped polysilicon, all regions of the patterned polysilicon layer 28 are made of undoped polysilicon. In the first embodiment, the patterned polysilicon layer 28 comprises both of undoped polysilicon 281 and doped polysilicon 282. In other words, a part of the patterned polysilicon layer 28 is made of undoped polysilicon 281 and the remains of the patterned polysilicon layer 28 are made of doped polysilicon 282. The undoped polysilicon 281 is denoted by section lines and the doped polysilicon 282 is denoted by a blank block. The doped polysilicon 282 is doped with N-type or P-type ions. The doped polysilicon 282 is more conductive than the undoped polysilicon 281. In addition, the undoped polysilicon 281 is intrinsic polysilicon. NAGA SIVAKUMAR YAGNAMURTHY proposed a paper in 2013 "EFFECT OF GRAIN STRUCTURE AND DOPING ON THE MECHANICAL PROPERTIES OF POLYSILICON THIN FILMS FOR MEMS". In the paper, the resistivity of undoped polysilicon is infinite and the resistivity of phospho-silicate glass (PSG) is lower. As a result, the undoped polysilicon of the present invention is viewed as an insulator that prevents from a short-circuit event occurring in two conductors. In order to detail the method for fabricating the CMOS MEMS microphone, the CMOS device 18 is specifically described as follows but the present invention is not limited thereto.

In the CMOS device 18, the semiconductor substrate 20 is a silicon substrate and the first oxide insulation layer 22 and the second oxide insulation layer 26 are $SiO_2$ layers. The metal wiring layer 30 further comprises an oxide insulation structure 32, a first metal layer 34, a second metal layer 36, a first metal via 38, a second metal via 40, a third metal layer 42, and a SiN layer 44. The oxide insulation structure 32 may comprise $SiO_2$. The first metal layer 34, the second metal layer 36, the first metal via 38, the second metal via 40, and the third metal layer 42 comprise conductive material. The oxide insulation structure 32 is formed on the second oxide insulation layer 26 and the patterned polysilicon layer 28. The first metal layer 34, the second metal layer 36, the first metal via 38, the second metal via 40, and the third metal layer 42 are embedded in the oxide insulation structure 32. The first metal layer 34, the second metal layer 36, and the third metal layer 42 separate from each other. The first metal layer 34, the second metal layer 36, and the third metal layer 42 are arranged from bottom to top. The first metal layer 34 separates from the patterned polysilicon layer 28. The first metal via 38 is arranged between the second metal layer 36 and the third metal layer 42 and electrically connected to the second metal layer 36 and the third metal layer 42. The second metal via 40 is connected to the third metal layer 42 and at least one of the second oxide insulation layer 26 and the undoped polysilicon 281 of the patterned polysilicon layer 28. In the first embodiment, the second metal via 40 is connected to the third metal layer 42 and the second oxide insulation layer 26 and the undoped polysilicon 281 of the patterned polysilicon layer 28.

Figure 2B:
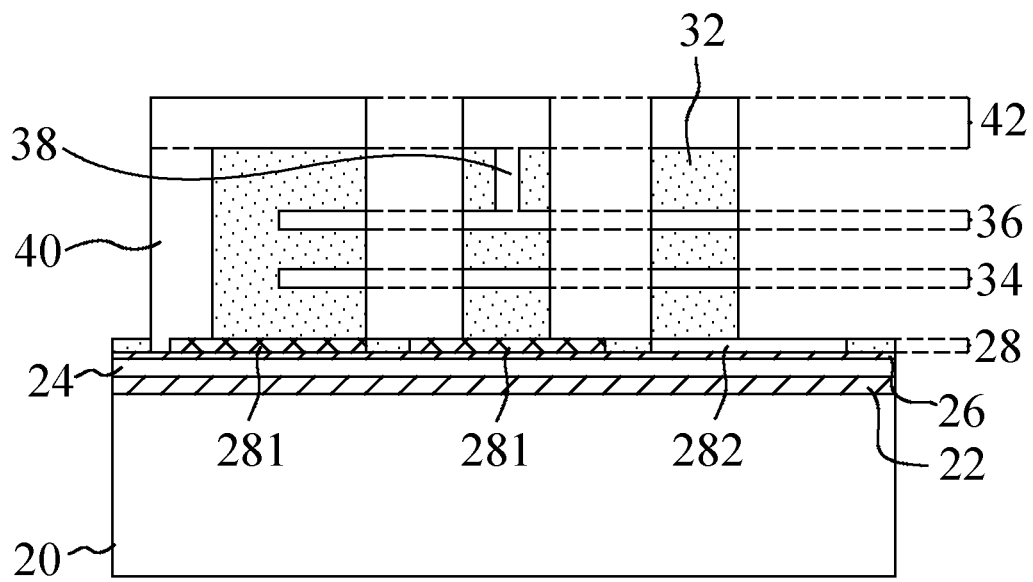
Figure 2C:
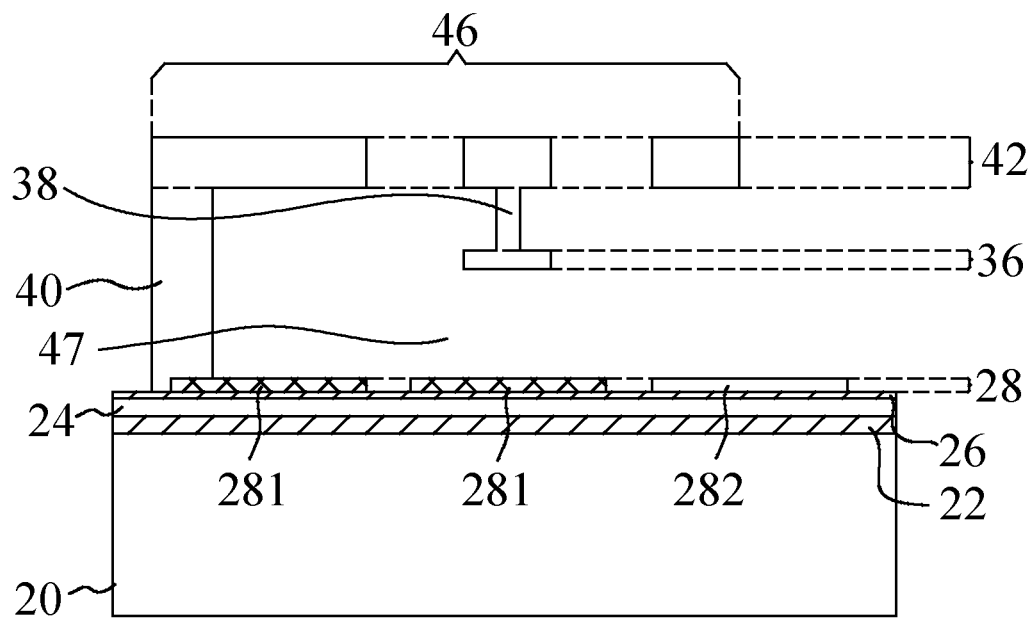

Then, as shown in FIG. 2(b), the SiN layer 44 and a part of the oxide insulation structure 32 are removed to expose a part of the patterned polysilicon layer 28 using a dry etching method. Next, as shown in FIG. 2(c), the remains of the oxide insulation structure 32, the first metal layer 34, and a part of the second metal layer 36 are removed using a wet etching method, such that the first metal via 38, the third metal layer 42, and the remains of the second metal layer 36 form a metal electrode 46 and a cavity 47 is formed between the metal electrode 46 and the patterned polysilicon layer 28. Since the conventional microphone has a vertical capacitance with a large area, a metal backplate is required to form the vertical capacitance. Distinct from the conventional microphone, the microphone of the present invention uses a lateral capacitance. Thus, the present invention needs the metal electrode 46 to form the lateral capacitance instead of requiring the metal backplate. In the steps of FIG. 2(c) and FIG. 2(b), the undoped polysilicon 281 of the patterned polysilicon layer 28 separates the doped polysilicon layer 24 from the oxide insulation structure 32, so as to avoid etching the doped polysilicon layer 24. Besides, the undoped polysilicon 281 of the patterned polysilicon layer 28 is formed between the doped polysilicon layer 24 and the metal electrode 46, such that the metal electrode 46 is arranged over the undoped polysilicon 281 of the patterned polysilicon layer 28 and the undoped polysilicon 281 separates the doped polysilicon layer 24 from the metal electrode 46. When the doped polysilicon layer 24 used as a vibration diaphragm vibrates and a voltage is applied across the doped polysilicon layer 24 and the metal electrode 46, a short-circuit event occurring in the doped polysilicon layer 24 and the metal electrode 46 is avoided. Finally, as shown in FIG. 2(d), in order to successfully transmit sound pressure to the diaphragm, the semiconductor substrate 20 is penetrated to have a chamber 48 and expose the first oxide insulation layer 22 using a deep reactive-ion etching (DRIE) method, thereby forming a MEMS microphone.

Figure 2D:
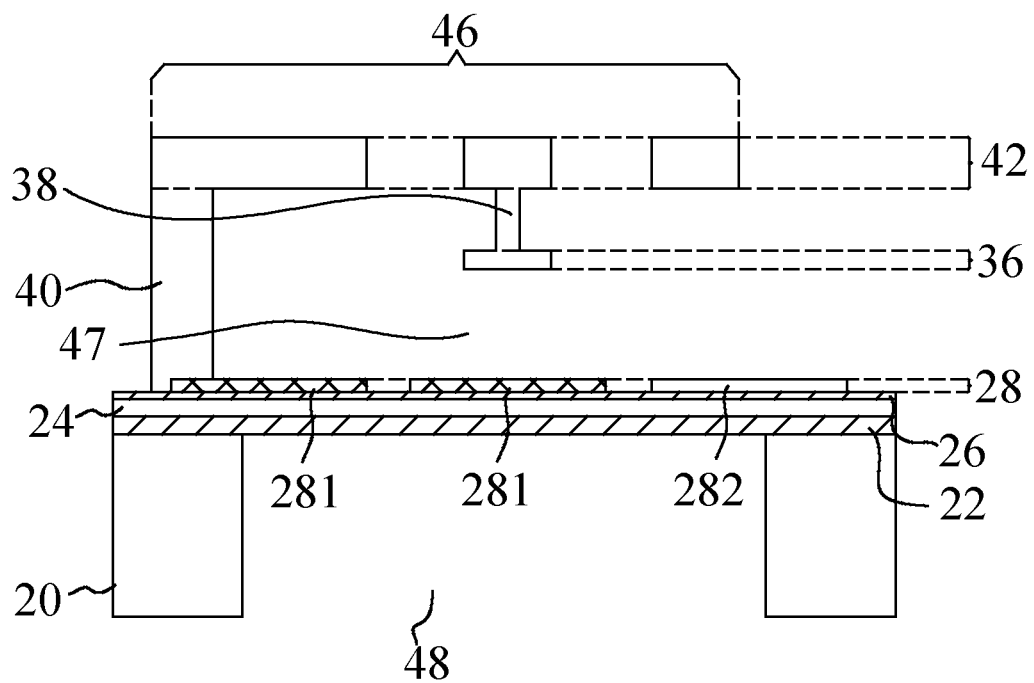

The steps of FIG. 2(b), FIG. 2(c), and FIG. 2(d) are sequentially performed. Alternatively, the steps of FIG. 2(b), FIG. 2(c), and FIG. 2(d) are simultaneously performed. In one step, the part of the metal wiring layer 30 is removed to form the metal electrode 46 over the undoped polysilicon 281, the undoped polysilicon 281 separates the metal electrode 46 from the doped polysilicon layer 24, and the semiconductor substrate 20 is penetrated to have the chamber 48 and expose the first oxide insulation layer 22, thereby forming the MEMS microphone.

Figure 3A:
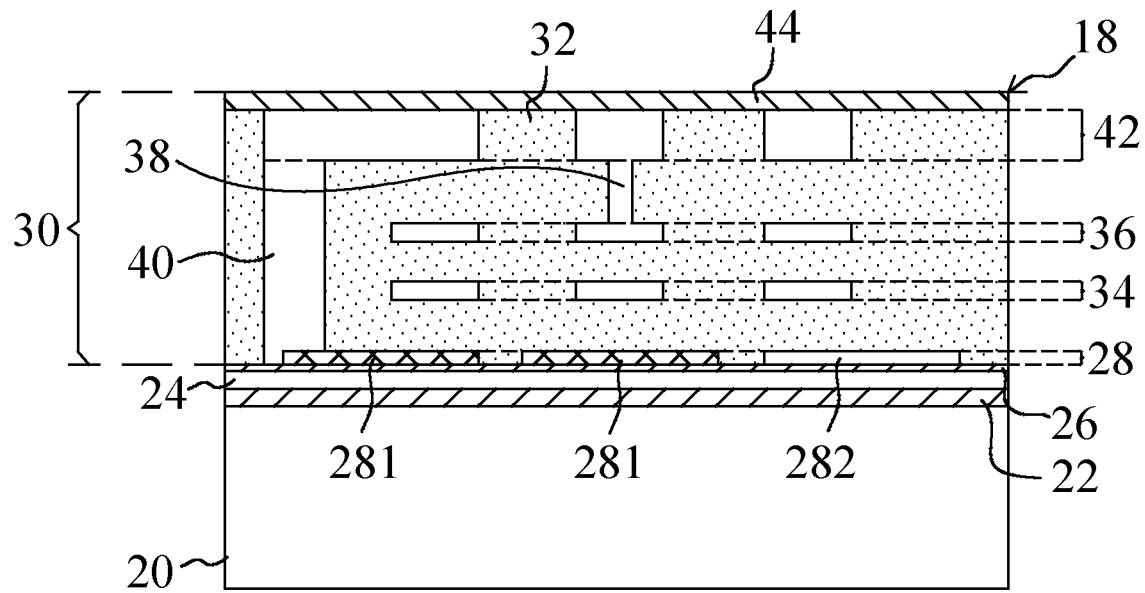
FIGS. 3(a)-3(d) are diagrams schematically showing the steps of fabricating a complementary metal-oxide-semiconductor (CMOS) micro electro-mechanical system (MEMS) microphone according to the second embodiment of the present invention.
Figure 3B:
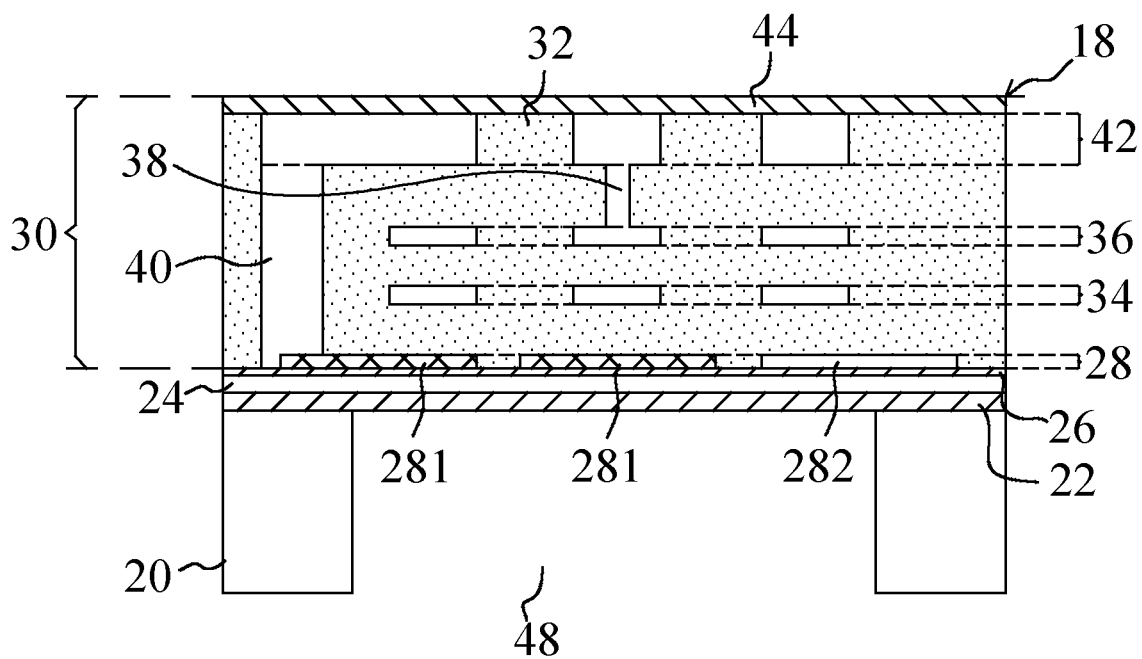
Figure 3C:
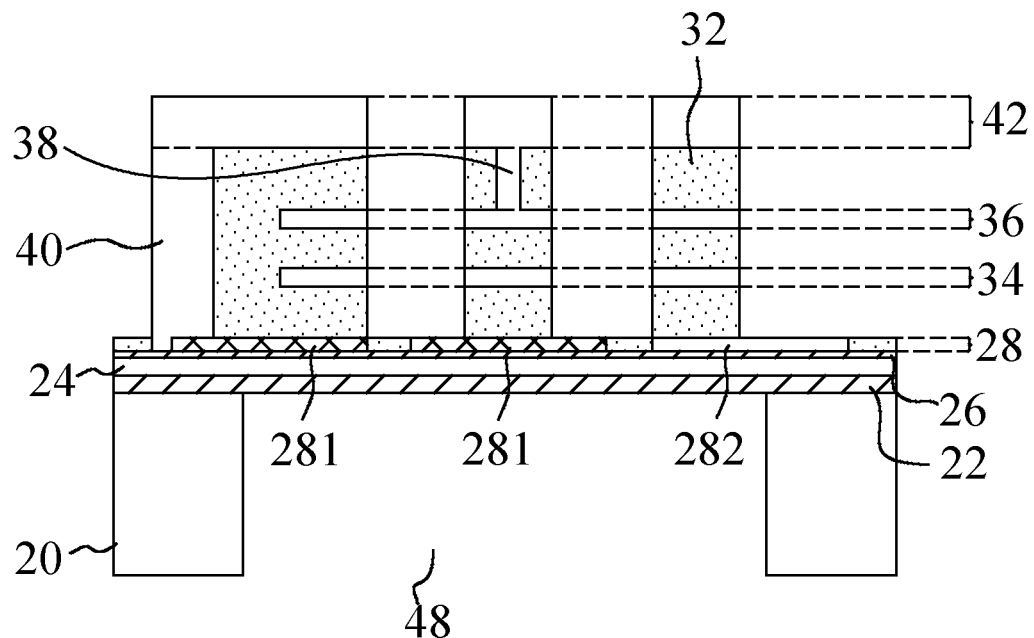
Figure 3D:
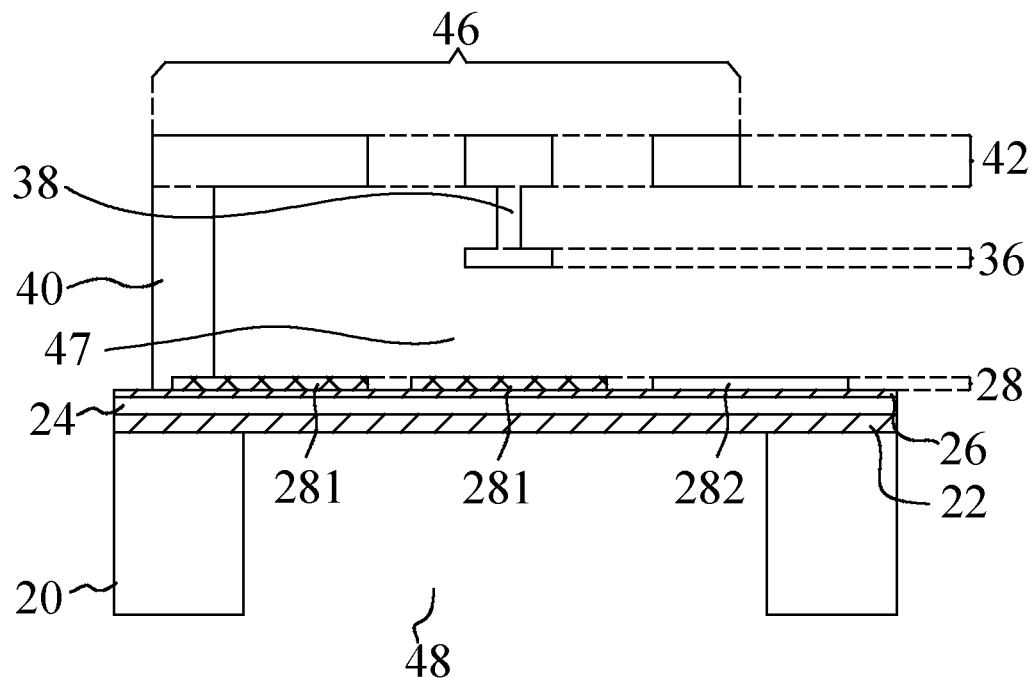

Refer to FIGS. 3(a)-3(d). The second embodiment of the method for fabricating a CMOS MEMS microphone is introduced as follows. Firstly, as shown in FIG. 3(a), a CMOS device 18 is provided. The structure of the CMOS device 18 in FIG. 3(a) is the same to that of the CMOS device 18 in FIG. 2(a) so will not reiterated. Then, as shown in FIG. 3(b), the semiconductor substrate 20 is penetrated have a chamber 48 and expose the first oxide insulation layer 22 using a DRIE method. Then, as shown in FIG. 3(c), a part of the oxide insulation structure 32 and the SiN layer 44 are removed to expose a part of the patterned polysilicon layer 28 using a dry etching method. Finally, as shown in FIG. 3(d), the remains of the oxide insulation structure 32, the first metal layer 34, and a part of the second metal layer 36 are removed using a wet etching method, such that the first metal via 38, the third metal layer 42, and the remains of the second metal layer 36 form a metal electrode 46 and a cavity 47 is formed between the metal electrode 46 and the patterned polysilicon layer 28, thereby forming a MEMS microphone. In the steps of FIG. 3(c) and FIG. 3(d), the undoped polysilicon 281 of the patterned polysilicon layer 28 separates the doped polysilicon layer 24 from the oxide insulation structure 32, so as to avoid etching the doped polysilicon layer 24. Besides, the undoped polysilicon 281 of the patterned polysilicon layer 28 is formed between the doped polysilicon layer 24 and the metal electrode 46, such that the metal electrode 46 is arranged over the undoped polysilicon 281 of the patterned polysilicon layer 28 and the undoped polysilicon 281 separates the doped polysilicon layer 24 from the metal electrode 46. When the doped polysilicon layer 24 used as a vibration diaphragm receives sound pressure through the chamber 48 to vibrate and a voltage is applied across the doped polysilicon layer 24 and the metal electrode 46, a short-circuit event occurring in the doped polysilicon layer 24 and the metal electrode 46 is avoided.

Figure 4A:
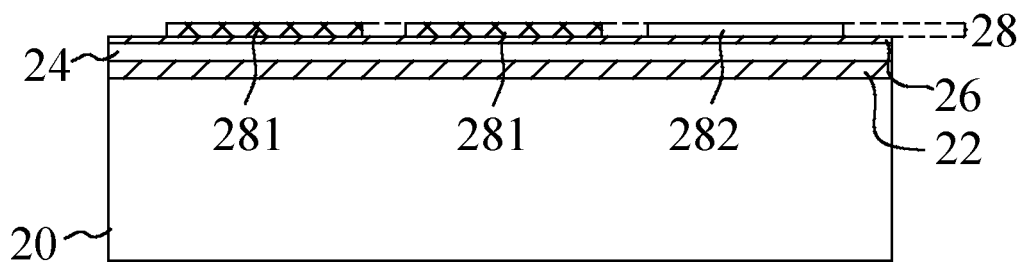
FIGS. 4(a)-4(b) are diagrams schematically showing the steps of fabricating a complementary metal-oxide-semiconductor (CMOS) device according to an embodiment of the present invention.
Figure 4B:
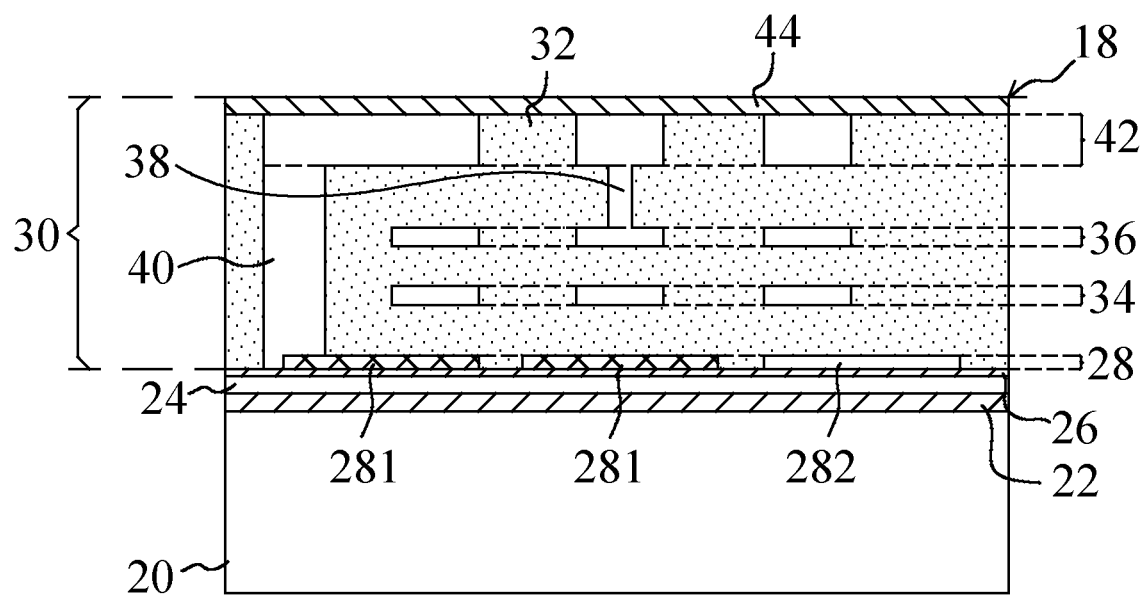

The process for fabricating the CMOS device 18 is introduced as follows, but the present invention is not limited thereto. Firstly, as shown in FIG. 4(a), the first oxide insulation layer 22 is formed on the semiconductor substrate 20 using thermal oxidation. Then, the doped polysilicon layer 24 is formed on the first oxide insulation layer 22 using ion implantation. Next, the second oxide insulation layer 26 is formed on the doped polysilicon layer 24 using thermal oxidation. Afterwards, the patterned polysilicon layer 28 is formed on the second oxide insulation layer 26 using patterning and etching processes and ion implantation. Finally, as shown in FIG. 4(b), the metal wiring layer 30 is formed on the patterned polysilicon layer 28 and the second oxide insulation layer 26 using thermal oxidation, patterning and etching processes and metal deposition.

Figure 5:
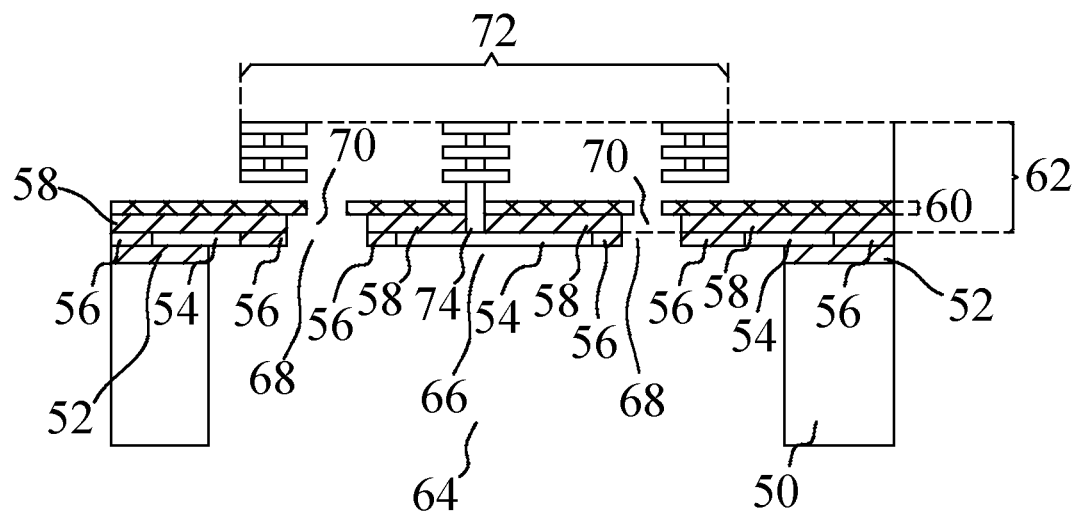
FIG. 5 is a diagram schematically showing a micro electro-mechanical system (MEMS) microphone according to an embodiment of the present invention.

Refer to FIG. 5. A CMOS MEMS microphone of the present invention is introduced as follows. The CMOS MEMS microphone comprises a semiconductor substrate 50, a first oxide insulation layer 52, a patterned doped polysilicon layer 54, at least one oxide insulation block 56, a second oxide insulation layer 58, a patterned undoped polysilicon layer 60, and a metal electrode 62, wherein the semiconductor substrate 50 may be a silicon substrate and the first oxide insulation layer 52, the oxide insulation block 56, and the second oxide insulation layer 58 may be $SiO_2$ layers. The patterned doped polysilicon layer 54 may be doped with N-type or P-type ions. The patterned doped polysilicon layer 54 is more conductive than the patterned undoped polysilicon layer 60. Besides, the patterned undoped polysilicon layer 60 is made of intrinsic polysilicon. NAGA SIVAKUMAR YAGNAMURTHY proposed a paper in 2013 "EFFECT OF GRAIN STRUCTURE AND DOPING ON THE MECHANICAL PROPERTIES OF POLYSILICON THIN FILMS FOR MEMS". In the paper, the resistivity of undoped polysilicon is infinite and the resistivity of phospho-silicate glass (PSG) is lower. As a result, the patterned undoped polysilicon layer 60 is viewed as an insulator that prevents from a short-circuit event occurring in two conductors. Since the conventional microphone has a vertical capacitance with a large area, a metal backplate is required to form the vertical capacitance. Distinct from the conventional microphone, the microphone of the present invention uses a lateral capacitance. Thus, the present invention needs the metal electrode 62 to form the lateral capacitance instead of requiring the metal backplate. The semiconductor substrate 50 is penetrated with a chamber 64. The first oxide insulation layer 52 is penetrated with a first opening 66 and formed on the semiconductor substrate 50, and the first opening 66 communicates with the chamber 64. The patterned doped polysilicon layer 54 and the oxide insulation block 56 are formed on the first oxide insulation layer 52, and the at least one oxide insulation block 56 is penetrated with at least one second opening 68 that communicates with the first opening 66. The second oxide insulation layer 58 is formed on the patterned doped polysilicon layer 54 and the at least one oxide insulation block 56, the second oxide insulation layer 58 is penetrated with at least one third opening 70, and the at least one third opening 70 communicates with the at least one second opening 68. The patterned undoped polysilicon layer 60 is formed on the second oxide insulation layer 58. The bottom of the metal electrode 62 penetrates through the patterned undoped polysilicon layer 60 and the second oxide insulation layer 58 and connecting to the patterned doped polysilicon layer 54, a part of the patterned undoped polysilicon layer 60 is formed between a part of the metal electrode 62 and a part of the patterned doped polysilicon layer 54, and the part of the patterned undoped polysilicon layer 60 separates the part of the metal electrode 62 from the part of the patterned doped polysilicon layer 54. The vertical position of the part of the metal electrode 62 is different from that of the part of the patterned doped polysilicon layer 54. The horizontal position of the part of the metal electrode 62 is different from that of the part of the patterned doped polysilicon layer 54. In other words, the part of the metal electrode 62 does not overlap and shield the part of the patterned doped polysilicon layer 54, lest electrostatic forces be vertically formed between the metal electrode 62 and the patterned doped polysilicon layer 54 such that the metal electrode 62 and the patterned doped polysilicon layer 54 attract to cause a short-circuit event and influence the efficiency of the microphone. The metal electrode 62 includes a metal structure 72 and a metal via 74. The top of the metal via 74 is connected to the bottom of the metal structure 72 and the bottom of the metal via 74 penetrates through the patterned undoped polysilicon layer 60 and the second oxide insulation layer 58 and electrically connects to the patterned doped polysilicon layer 54. A cavity is formed between the metal structure 72 and the patterned undoped polysilicon layer 60.

Figure 6A:
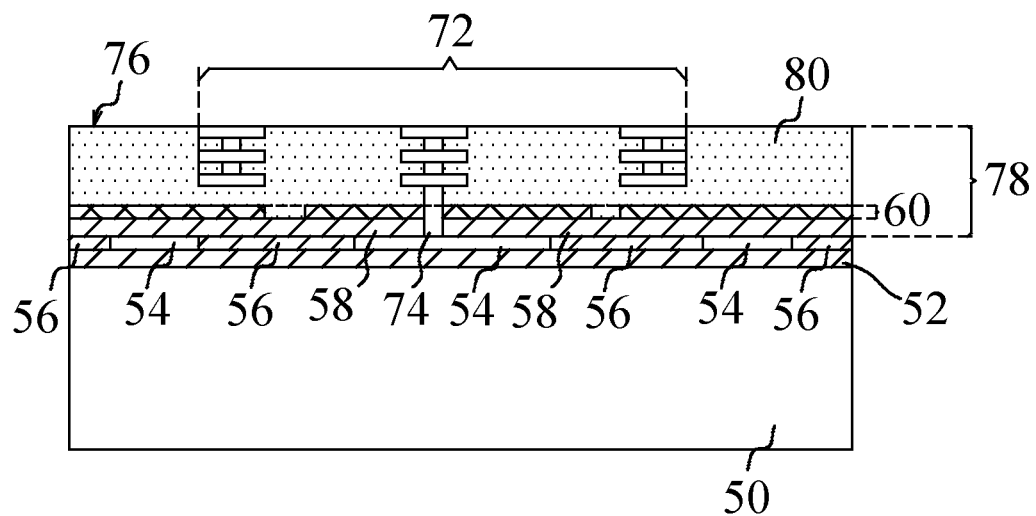
FIGS. 6(a)-6(c) are diagrams schematically showing the steps of fabricating a complementary metal-oxide-semiconductor (CMOS) micro electro-mechanical system (MEMS) microphone according to the third embodiment of the present invention.
Figure 6B:
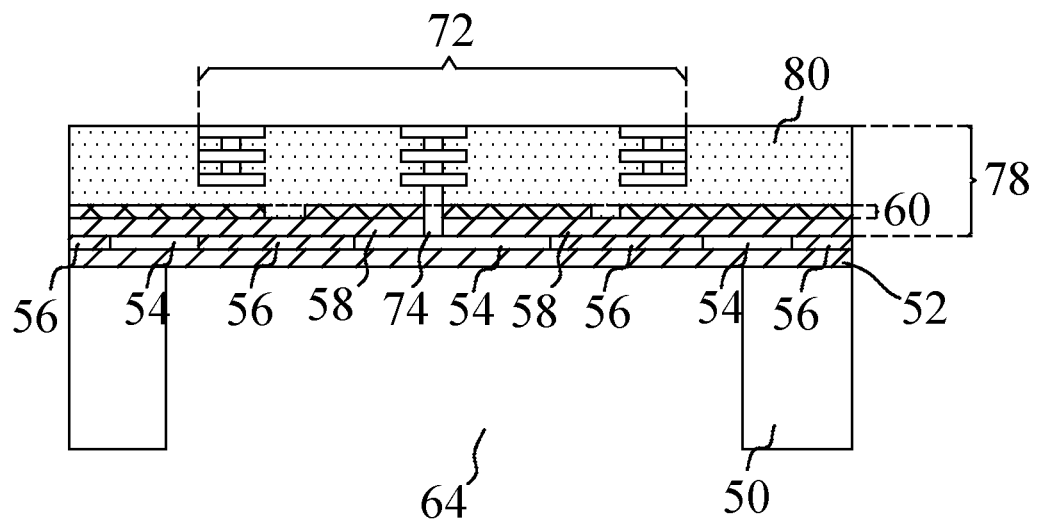
Figure 6C:
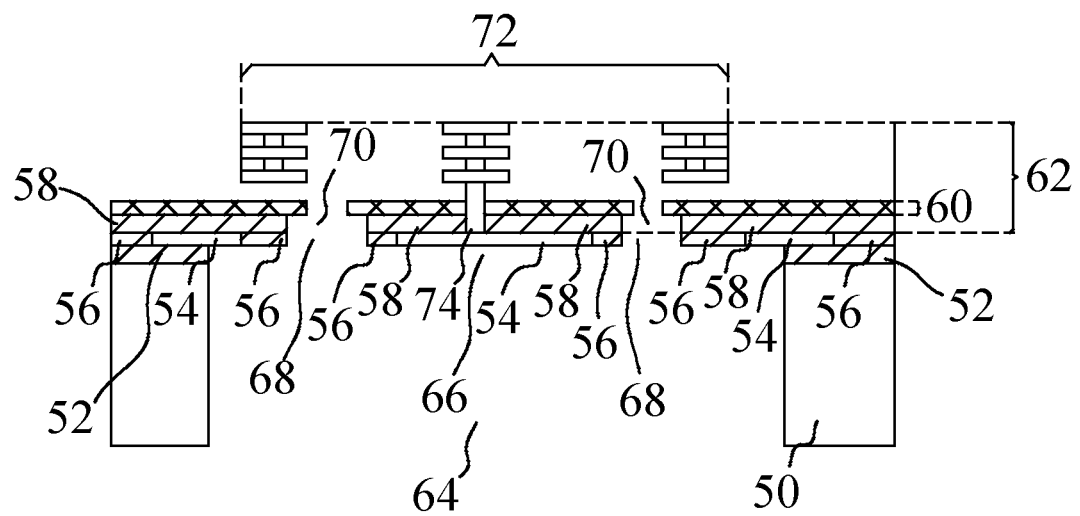

Refer to FIGS. 6(*a*)-6(*c*). The third embodiment of the method for fabricating a CMOS MEMS microphone is introduced as follows. Firstly, as shown in FIG. 6(*a*), a CMOS device 76 is provided, which comprises a semiconductor substrate 50, a first oxide insulation layer 52, a patterned doped polysilicon layer 54, at least one oxide insulation block 56, a second oxide insulation layer 58, a patterned undoped polysilicon layer 60, and a metal wiring layer 78. The first oxide insulation layer 52 is formed on the semiconductor substrate 50. The patterned doped polysilicon layer 54 and the oxide insulation block 56 are formed on the first oxide insulation layer 52. The second oxide insulation layer 58 is formed on the patterned doped polysilicon layer 54 and the oxide insulation block 56. The metal wiring layer 78 is formed on the second oxide insulation layer 58. In order to detail the method for fabricating the CMOS MEMS microphone, the CMOS device 76 of the third embodiment is specifically described as follows but the present invention is not limited thereto.

Specifically, the metal wiring layer 78 further comprises an oxide insulation structure 80, a metal structure 72, and a metal via 74. For example, the oxide insulation structure 80 comprises $SiO_2$. The oxide insulation structure 80 is formed on the second oxide insulation layer 58 and the patterned undoped polysilicon layer 60. The metal structure 72 and the metal via 74 are embedded in the oxide insulation structure 80. The top of the metal via 74 is electrically connected to the bottom of the metal structure 72. The bottom of the metal via 74 penetrates through the patterned undoped polysilicon layer 60 and the second oxide insulation layer 58 to electrically connect to the patterned doped polysilicon layer 54.

Then, as shown in FIG. 6(*b*), in order to successfully transmit sound pressure to a diaphragm formed by the patterned doped polysilicon layer 54 and the oxide insulation block 56, the semiconductor substrate 50 is bored to have a chamber 64 using a DRIE method.

Finally, as shown in FIG. 6(*c*), the oxide insulation structure 80, a part of the second oxide insulation layer 58, a part of the oxide insulation block 56, and a part of the first oxide insulation layer 52 are removed to expose the patterned undoped polysilicon layer 60, the metal via 74 and the metal structure 72 form the metal electrode 62, and a cavity is formed between the metal structure 72 and the patterned undoped polysilicon layer 60, thereby forming a MEMS microphone. In the step, the patterned undoped polysilicon layer 60 separates the patterned doped polysilicon layer 54 from the oxide insulation structure 80, so as to avoid etching the patterned doped polysilicon layer 54. In addition, the patterned undoped polysilicon layer 60 is formed between the patterned doped polysilicon layer 54 and the metal electrode 62, such that the metal electrode 62 is formed over the patterned undoped polysilicon layer 60, and the patterned undoped polysilicon layer 60 separates the patterned doped polysilicon layer 54 from the metal electrode 62. As a result, when the diaphragm formed by the patterned doped polysilicon layer 54 and the oxide insulation block 56 vibrates and the voltage is applied across the patterned doped polysilicon layer 54 and the metal electrode 62, a short-circuit event occurring in the patterned doped polysilicon layer 54 and the metal electrode 62 is avoided.

The steps of FIG. 6(*a*), and FIG. 6(*b*) are sequentially performed. Alternatively, the steps of FIG. 6(*a*), and FIG. 6(*b*) are simultaneously performed. In one step, the part of the metal wiring layer 78, the part of the second oxide insulation layer 58, the part of the oxide insulation block 56, and the part of the first oxide insulation layer 52 are etched and removed to form the metal electrode 62. The part of the patterned undoped polysilicon layer 60, formed between the part of the metal electrode 62 and the part of the patterned doped polysilicon layer 54, separates the part of the metal electrode 62 from the part of the patterned doped polysilicon layer 54. The horizontal position of the part of the metal electrode 62 is different from that of the part of the patterned doped polysilicon layer 54. The semiconductor substrate 50 is penetrated to have a chamber 64 and expose the patterned doped polysilicon layer 54, thereby forming a MEMS microphone.

Figure 7A:
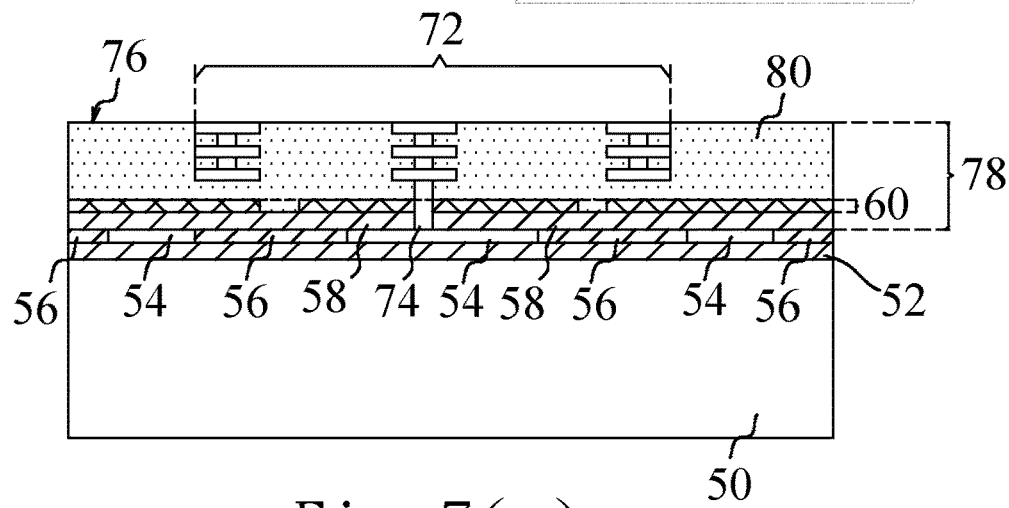
FIGS. 7(a)-7(c) are diagrams schematically showing the steps of fabricating a complementary metal-oxide-semiconductor (CMOS) micro electro-mechanical system (MEMS) microphone according to the fourth embodiment of the present invention.
Figure 7B:
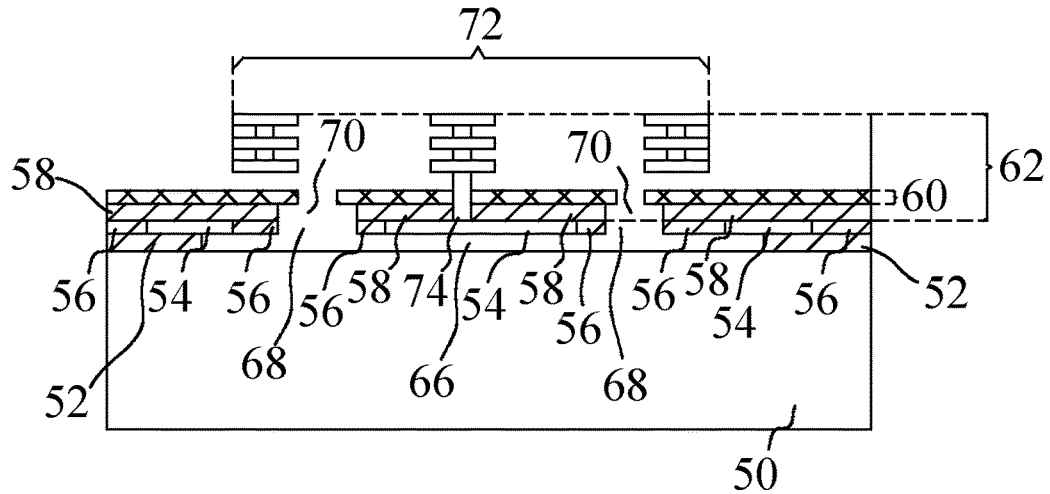
Figure 7C:
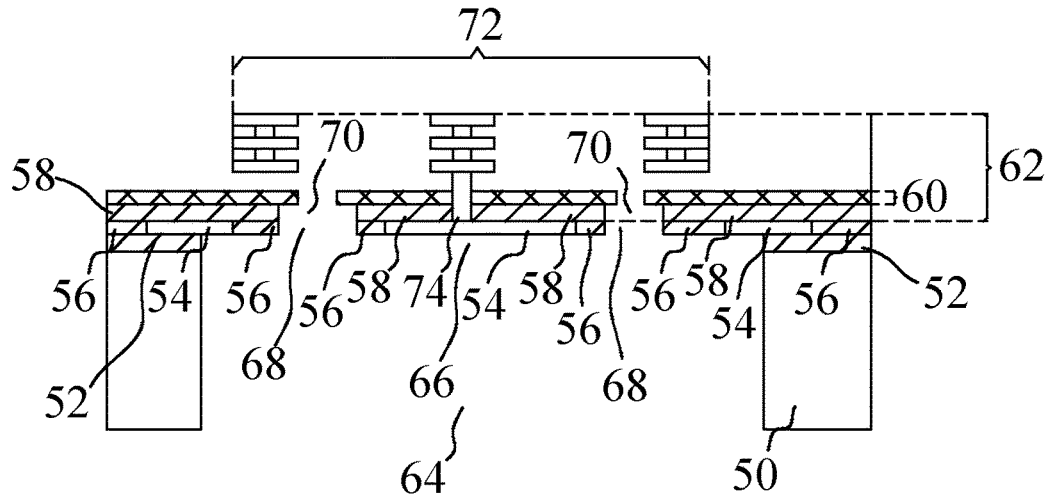

Refer to FIGS. 7(*a*)-7(*c*). The third embodiment of the method for fabricating a CMOS MEMS microphone is introduced as follows. Firstly, as shown in FIG. 7(*a*), a CMOS device 76 is provided. The structure of the CMOS device 76 in FIG. 7(*a*) is the same to that of the CMOS device 76 in FIG. 6(*a*) so will not reiterated. Then, as shown in FIG. 7(*b*), the oxide insulation structure 80, a part of the second oxide insulation layer 58, a part of the oxide insulation block 56, and a part of the first oxide insulation layer 52 are removed using dry and wet etching methods, the metal via 74 and the metal structure 72 form the metal electrode 62, and a cavity is formed between the metal structure 72 and the patterned undoped polysilicon layer 60, thereby forming a MEMS microphone. In the step, the patterned undoped polysilicon layer 60 separates the patterned doped polysilicon layer 54 from the oxide insulation structure 80, so as to avoid etching the patterned doped polysilicon layer 54. In addition, the patterned undoped polysilicon layer 60 is formed between the patterned doped polysilicon layer 54 and the metal electrode 62, such that the metal electrode 62 is formed over the patterned undoped polysilicon layer 60, and the patterned undoped polysilicon layer 60 separates the patterned doped polysilicon layer 54 from the metal electrode 62. As a result, when the diaphragm formed by the patterned doped polysilicon layer 54 and the oxide insulation block 56 vibrates and the voltage is applied across the patterned doped polysilicon layer 54 and the metal electrode 62, a short-circuit event occurring in the patterned doped polysilicon layer 54 and the metal electrode 62 is avoided. Finally, as shown in FIG. 7(c), in order to successfully transmit sound pressure to a diaphragm formed by the patterned doped polysilicon layer 54 and the oxide insulation block 56, the semiconductor substrate 50 is bored to have a chamber 64 using a DRIE method.

Figure 8A:
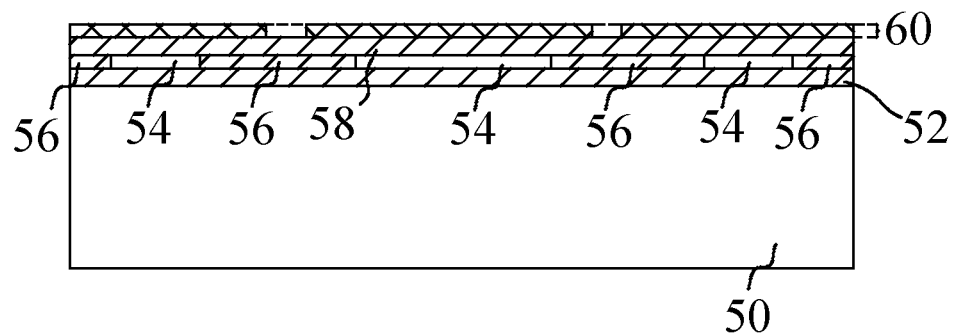
FIGS. 8(a)-8(b) are diagrams schematically showing the steps of fabricating a complementary metal-oxide-semiconductor (CMOS) device according to another embodiment of the present invention.
Figure 8B:
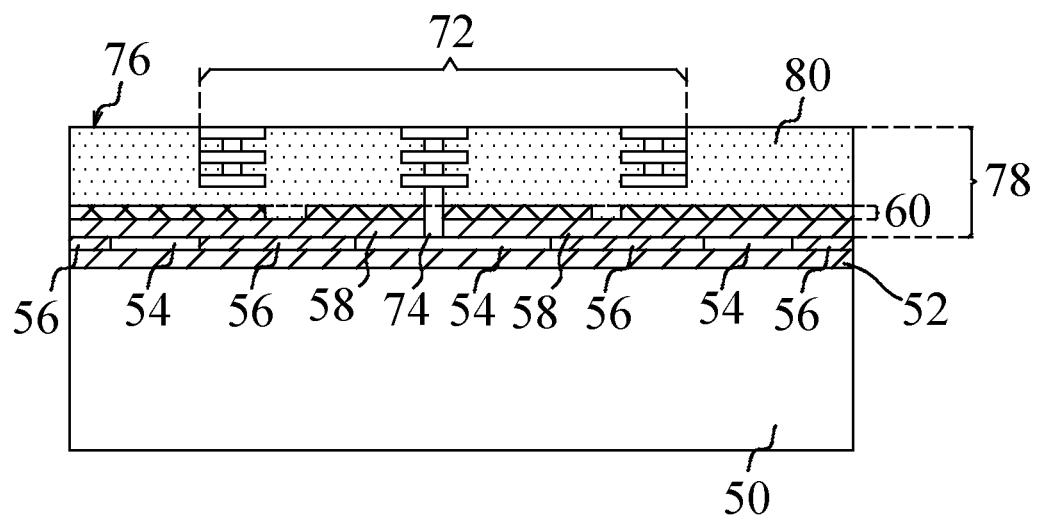

The process for fabricating the CMOS device 76 is introduced as follows, but the present invention is not limited thereto. Firstly, as shown in FIG. 8(a), the first oxide insulation layer 52 is formed on the semiconductor substrate 50 using thermal oxidation. Then, the patterned doped polysilicon layer 54 and the oxide insulation block 56 are formed on the first oxide insulation layer 52 using patterning and etching processes, ion implantation, and thermal oxidation. Next, the second oxide insulation layer 58 is formed on the patterned doped polysilicon layer 54 and the oxide insulation block 56 using thermal oxidation. Afterwards, the patterned undoped polysilicon layer 60 is formed on the second oxide insulation layer 58 using patterning and etching processes and ion implantation. Finally, as shown in FIG. 8(b), the metal wiring layer 78 is formed on the patterned undoped polysilicon layer 60 and the second oxide insulation layer 58 using thermal oxidation, patterning and etching processes and metal deposition. The metal wiring layer 78 penetrates through the patterned undoped polysilicon layer 60 and the second oxide insulation layer 58 to electrically connect to the patterned doped polysilicon layer 54.

In conclusion, the present invention uses the undoped polysilicon of the patterned polysilicon layer to separate the doped polysilicon layer from the metal electrode, thereby avoiding a short-circuit event occurring in the doped polysilicon layer and the metal electrode and etching the doped polysilicon layer.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A method for fabricating a complementary metal-oxide-semiconductor (CMOS) micro electro-mechanical system (MEMS) microphone comprising:
providing a complementary metal-oxide-semiconductor (CMOS) device comprising a semiconductor substrate, a first oxide insulation layer, a doped polysilicon layer, a second oxide insulation layer, a patterned polysilicon layer, and a metal wiring layer from bottom to top, the metal wiring layer is formed on the second oxide insulation layer, and the patterned polysilicon layer comprises undoped polysilicon; and
removing a part of the metal wiring layer to form a metal electrode over the undoped polysilicon, using the undoped polysilicon to separate the metal electrode from the doped polysilicon layer, and penetrating through the semiconductor substrate to form a chamber and expose the first oxide insulation layer, thereby forming a micro electro-mechanical system (MEMS) microphone.

2. The method for fabricating the CMOS MEMS microphone according to claim 1, wherein in the step of removing the part of the metal wiring layer to form the metal electrode and penetrating through the semiconductor substrate to form the chamber and expose the first oxide insulation layer, after removing the part of the metal wiring layer to form the metal electrode, the semiconductor substrate is penetrated to have the chamber and expose the first oxide insulation layer.

3. The method for fabricating the CMOS MEMS microphone according to claim 1, wherein the metal wiring layer comprises an oxide insulation structure, a first metal layer, a second metal layer, a first metal via, a second metal via, and a third metal layer, the first metal layer, the second metal layer, the first metal via, the second metal via, and the third metal layer comprise conductive material, the oxide insulation structure is formed on the second oxide insulation layer and the patterned polysilicon layer, the first metal layer, the second metal layer, the first metal via, the second metal via, and the third metal layer are embedded in the oxide insulation structure, the first metal layer, the second metal layer, and the third metal layer separate from each other, the first metal layer, the second metal layer, and the third metal layer are formed from bottom to top, the first metal layer separates from the patterned polysilicon layer, the first metal via is formed between the second metal layer and the third metal layer and electrically connected to the second metal layer and the third metal layer, and the second metal via is connected to the third metal layer and at least one of the second oxide insulation layer and the undoped polysilicon.

4. The method for fabricating the CMOS MEMS microphone according to claim 3, wherein in the step of removing the part of the metal wiring layer to form the metal electrode, after removing a part of the oxide insulation structure to expose a part of the patterned polysilicon layer, remains of the oxide insulation structure, the first metal layer, and a part of the second metal layer are removed and the first metal via, the third metal layer, and remains of the second metal layer form the metal electrode.

5. The method for fabricating the CMOS MEMS microphone according to claim 4, wherein the part of the oxide insulation structure is removed using a dry etching method and the remains of the oxide insulation structure, the first metal layer, and the part of the second metal layer are removed using a wet etching method.

6. The method for fabricating the CMOS MEMS microphone according to claim 1, wherein the patterned polysilicon layer further comprises doped polysilicon.

7. A method for fabricating a complementary metal-oxide-semiconductor (CMOS) micro electro-mechanical system (MEMS) microphone comprising:
providing a complementary metal-oxide-semiconductor (CMOS) device comprising a semiconductor substrate, a first oxide insulation layer, a patterned doped polysilicon layer, at least one oxide insulation block, a second oxide insulation layer, a patterned undoped polysilicon layer, and a metal wiring layer, the first oxide insulation layer is formed on the semiconductor substrate, the patterned doped polysilicon layer and the at least one oxide insulation block are formed on the first oxide insulation layer, the second oxide insulation layer is formed on the patterned doped polysilicon layer and the at least one oxide insulation block, and the metal wiring layer is formed on the second oxide insulation layer; and removing a part of the metal wiring layer, a part of the second oxide insulation layer, a part of the at least one oxide insulation block, and a part of the first oxide insulation layer to form a metal electrode, a part of the patterned undoped polysilicon layer is formed between a part of the metal electrode and a part of the patterned doped polysilicon layer, using the part of the patterned undoped polysilicon layer to separate the part of the metal electrode from the part of the patterned doped polysilicon layer, a horizontal position of the part of the metal electrode is different from a horizontal position of the part of the patterned doped polysilicon layer, and penetrating through the semiconductor substrate to form a chamber and expose the patterned doped polysilicon layer, thereby forming a micro electro-mechanical system (MEMS) microphone.

8. The method for fabricating the CMOS MEMS microphone according to claim 7, wherein in step of removing the part of the metal wiring layer, the part of the second oxide insulation layer, the part of the at least one oxide insulation block, and the part of the first oxide insulation layer to form the metal electrode and penetrating through the semiconductor substrate to form the chamber and expose the patterned doped polysilicon layer, after penetrating through the semiconductor substrate to form the chamber, the part of the metal wiring layer, the part of the second oxide insulation layer, the part of the at least one oxide insulation block, and the part of the first oxide insulation layer are removed to form the metal electrode and expose the patterned doped polysilicon layer.

9. The method for fabricating the CMOS MEMS microphone according to claim 7, wherein the semiconductor substrate is a silicon substrate and the first oxide insulation layer, the at least one oxide insulation block, and the second oxide insulation layer comprise $SiO_2$.

10. A complementary metal-oxide-semiconductor (CMOS) micro electro-mechanical system (MEMS) microphone comprising:
   a semiconductor substrate penetrated with a chamber;
   a first oxide insulation layer penetrated with a first opening and formed on the semiconductor substrate, and the first opening communicates with the chamber;
   a patterned doped polysilicon layer and at least one oxide insulation block formed on the first oxide insulation layer, and the at least one oxide insulation block is penetrated with at least one second opening that communicates with the first opening;
   a second oxide insulation layer formed on the patterned doped polysilicon layer and the at least one oxide insulation block, the second oxide insulation layer is penetrated with at least one third opening, and the at least one third opening communicates with the at least one second opening;
   a patterned undoped polysilicon layer formed on the second oxide insulation layer; and
   a metal electrode with a bottom thereof penetrating through the patterned undoped polysilicon layer and the second oxide insulation layer and connecting to the patterned doped polysilicon layer, a part of the patterned undoped polysilicon layer is formed between a part of the metal electrode and a part of the patterned doped polysilicon layer, the part of the patterned undoped polysilicon layer separates the part of the metal electrode from the part of the patterned doped polysilicon layer, and a horizontal position of the part of the metal electrode is different from a horizontal position of the part of the patterned doped polysilicon layer.

11. The CMOS MEMS microphone according to claim 10, wherein the semiconductor substrate is a silicon substrate and the first oxide insulation layer, the at least one oxide insulation block, and the second oxide insulation layer comprise $SiO_2$.

* * * * *